(12) United States Patent
Chang et al.

(10) Patent No.: US 7,306,979 B2
(45) Date of Patent: Dec. 11, 2007

(54) METHOD OF FABRICATING THIN FILM TRANSISTOR SUBSTRATE FOR DISPLAY DEVICE

(75) Inventors: Youn Gyoung Chang, Kyounggi-do (KR); Heung Lyul Cho, Kyounggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 94 days.

(21) Appl. No.: 11/391,439

(22) Filed: Mar. 29, 2006

(65) Prior Publication Data

US 2006/0194374 A1    Aug. 31, 2006

Related U.S. Application Data

(62) Division of application No. 10/962,541, filed on Oct. 13, 2004, now Pat. No. 7,064,347.

(30) Foreign Application Priority Data

Oct. 14, 2003    (KR) ........................ 10-2003-71503

(51) Int. Cl.
*H01L 21/00* (2006.01)
*H01L 21/84* (2006.01)
*H01L 21/336* (2006.01)

(52) U.S. Cl. .................. 438/149; 438/48; 438/128; 438/151; 438/157; 438/283; 257/59; 257/71; 257/72; 257/57; 257/E21.411

(58) Field of Classification Search ............ 438/149, 438/128, 48, 151, 157, 283; 257/59, 72, 257/71, 57, E21.411
See application file for complete search history.

(56) References Cited

U.S. PATENT DOCUMENTS

| | | | | |
|---|---|---|---|---|
| 5,796,448 A | * | 8/1998 | Kim | 349/39 |
| 6,411,346 B1 | * | 6/2002 | Numano et al. | 349/39 |
| 6,531,346 B1 | * | 3/2003 | Kim | 438/149 |
| 6,620,660 B2 | * | 9/2003 | Ohtani et al. | 438/158 |
| 6,627,470 B2 | * | 9/2003 | Yoo et al. | 438/30 |
| 6,710,372 B2 | * | 3/2004 | Kim | 257/72 |

(Continued)

*Primary Examiner*—Michael Lebentritt
*Assistant Examiner*—Mohsen Ahmadi
(74) *Attorney, Agent, or Firm*—Morgan, Lewis & Bockius LLP

(57) ABSTRACT

A method of fabricating a thin film transistor substrate for a display device is provided. The method includes the steps of forming a gate line and a gate electrode connected to the gate line; forming a gate insulating film disposed covering the gate line and the gate electrode; forming a semiconductor layer a on the gate insulating film; forming a data line on the gate insulating film intersecting the gate line with the gate insulating film between the data line and the gate line to define a pixel region, a source electrode connected to the data line, a drain electrode opposed to the source electrode with the semiconductor layer therebetween, and a first upper storage electrode overlapping the gate line with the gate insulating film and the semiconductor layer therebetween; forming a protective film disposed covering the gate line, the data line, and the thin film transistor; and forming a pixel electrode connected on a side surface basis to the drain electrode and the first upper storage electrode, and a second upper storage electrode connected via a first contact hole to the first upper storage electrode on a side surface basis.

11 Claims, 22 Drawing Sheets

U.S. PATENT DOCUMENTS

| | | | |
|---|---|---|---|
| 6,849,873 B2* | 2/2005 | Baek et al. .................... | 257/72 |
| 6,905,917 B2* | 6/2005 | Song et al. ................... | 438/149 |
| 6,919,945 B2* | 7/2005 | Ha ............................. | 349/114 |
| 2002/0130324 A1 | 9/2002 | Song et al. | |
| 2004/0048407 A1* | 3/2004 | Lee ............................ | 438/30 |
| 2004/0166613 A1* | 8/2004 | Shih ........................... | 438/149 |
| 2005/0133787 A1* | 6/2005 | Park ........................... | 257/57 |

* cited by examiner

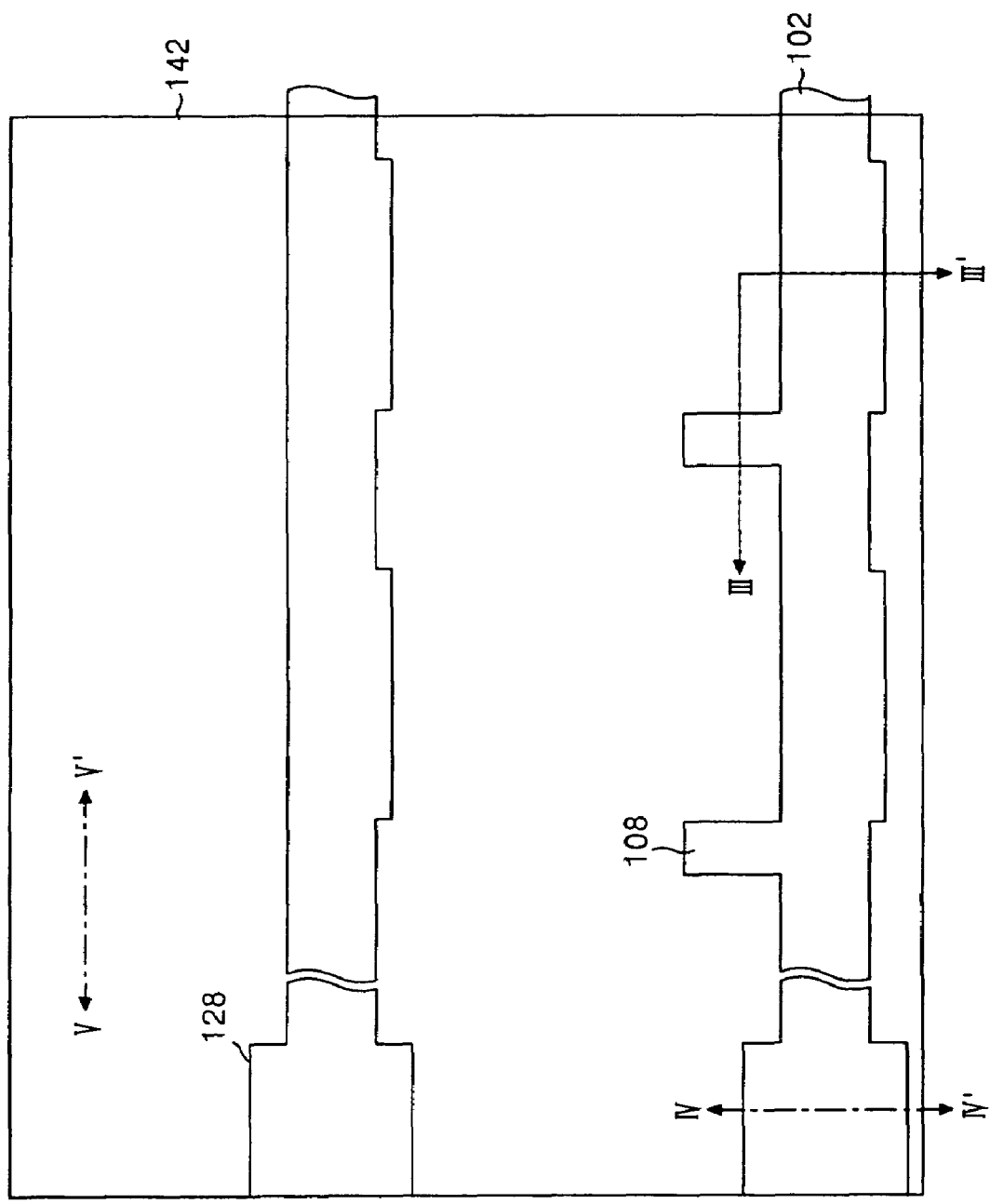

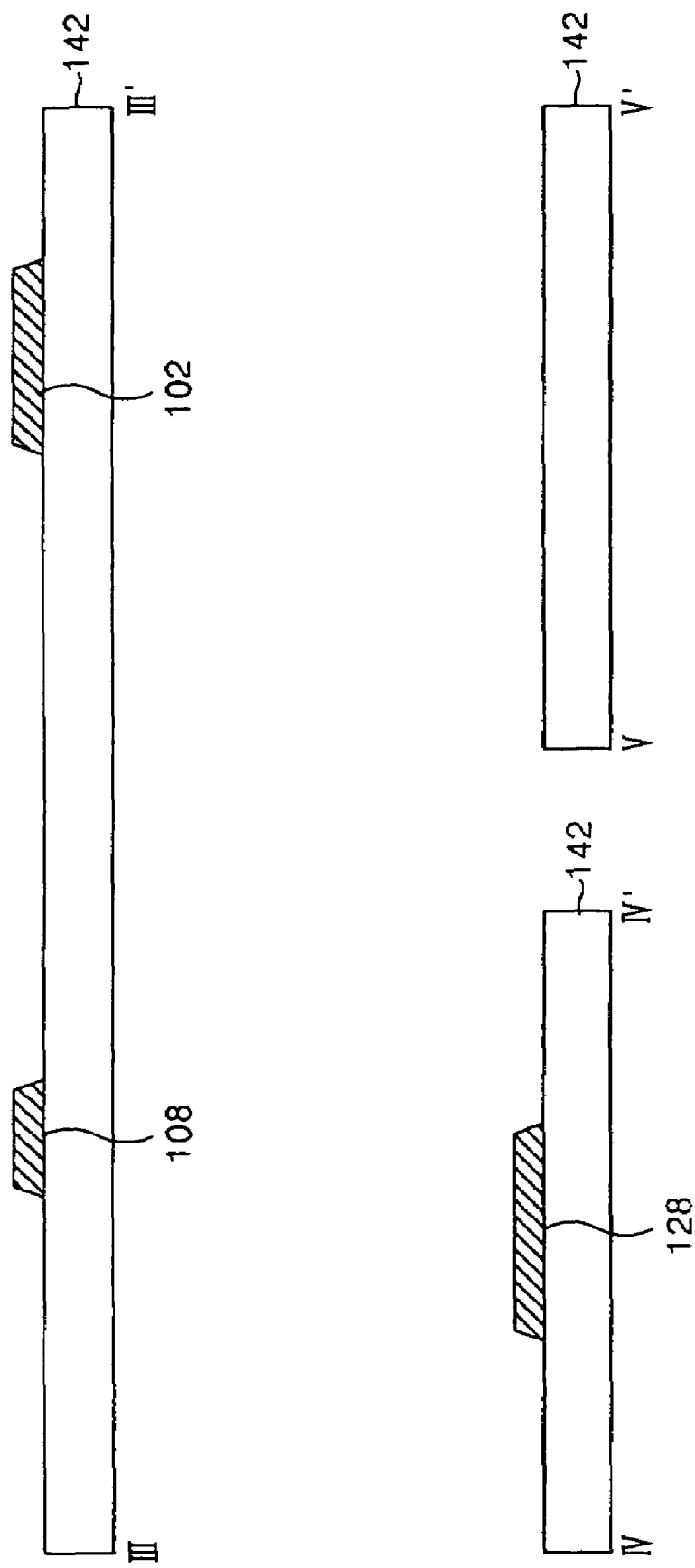

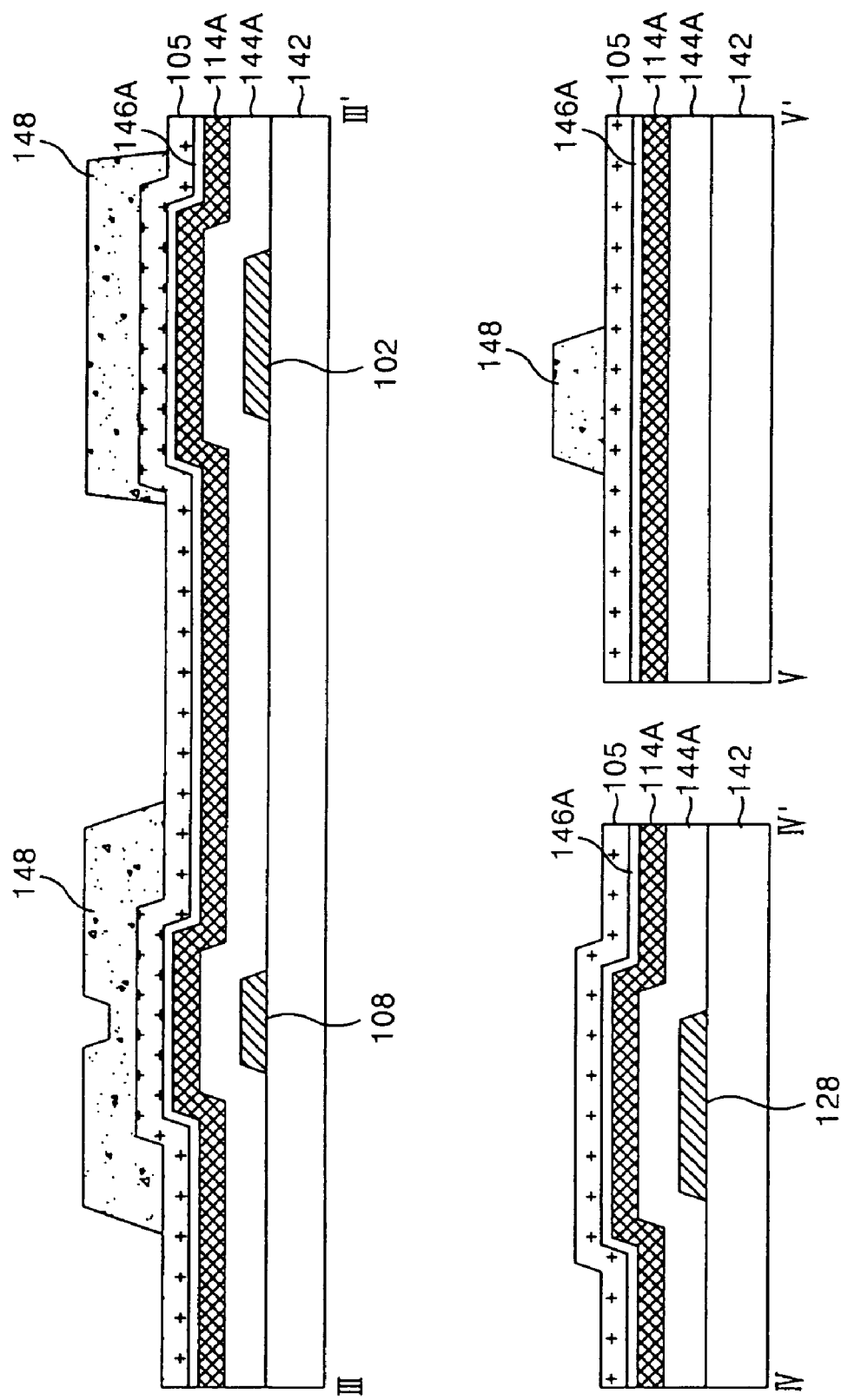

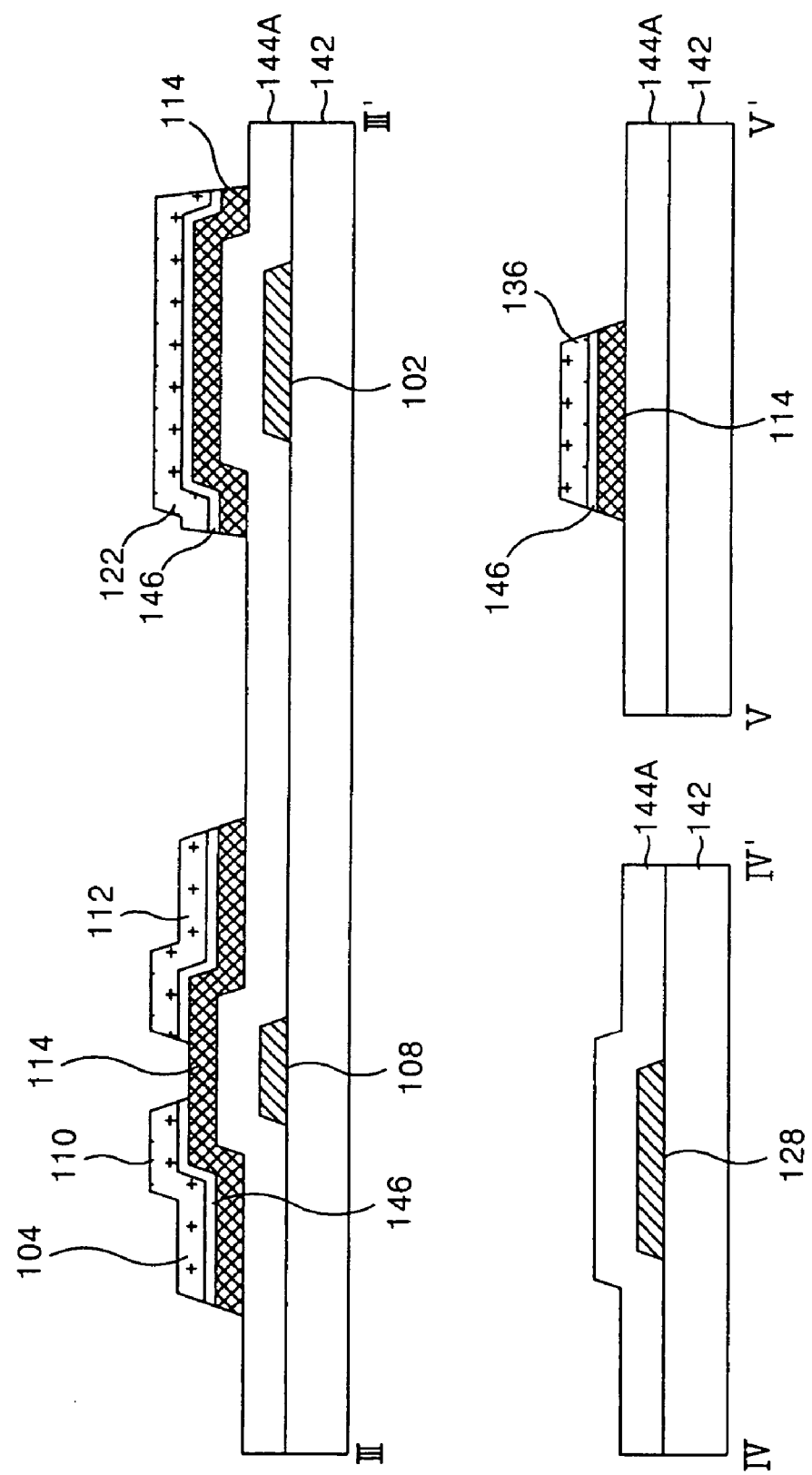

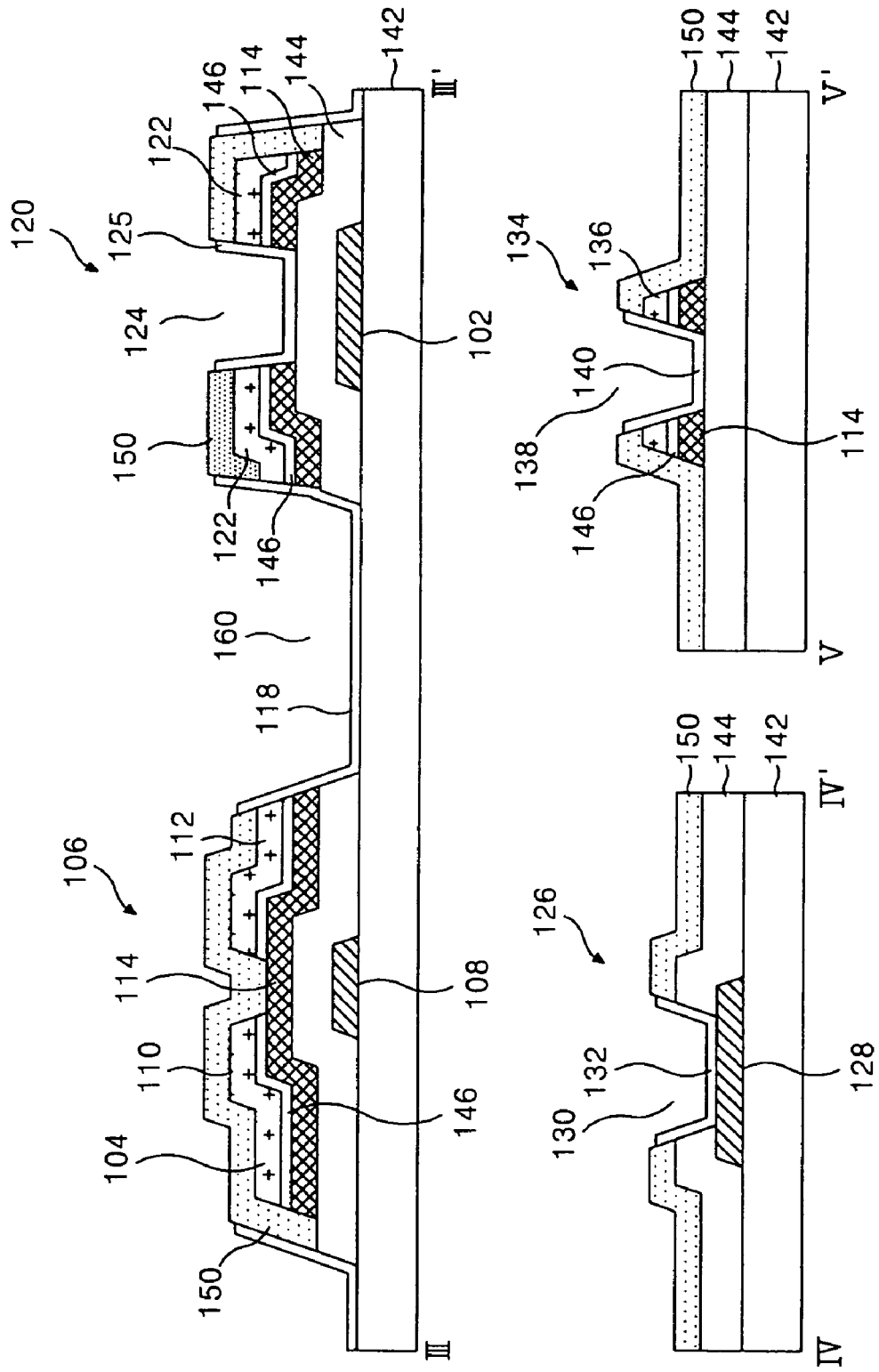

METHOD OF FABRICATING THIN FILM TRANSISTOR SUBSTRATE FOR DISPLAY DEVICE

This is a divisional application of U.S. patent application Ser. No. 10/962,541, filed Oct. 13, 2004 now U.S. Pat. No. 7,064,347, which is hereby incorporated by reference. This application also claims the benefit of Korean Patent Application No. P2003-71503 filed in Korea on Oct. 14, 2003, which is hereby incorporated by reference.

BACKGROUND OF THE INVENTION

1. Field of the Invention

This invention relates to a liquid crystal display, and more particularly, to a thin film transistor substrate for a display device and a fabricating method thereof.

2. Description of the Related Art

Generally, a liquid crystal display (LCD) controls light transmittance of liquid crystal material using an electric field, thereby displaying a picture. To this end, the LCD includes a liquid crystal display panel having liquid crystal cells arranged in a matrix, and a driving circuit for driving the liquid crystal display panel. The liquid crystal display panel includes a thin film transistor substrate and a color filter substrate opposed to each other, liquid crystal injected between two substrates, and a spacer to maintain a cell gap between two substrates.

The thin film transistor substrate includes gate lines, data lines, thin film transistors formed as switching devices for each intersection between the gate lines and the data lines, pixel electrodes formed for each liquid crystal cell and connected to the thin film transistor, and alignment films coated thereon. The gate lines and the data lines receive signals from the driving circuits via each pad portion. The thin film transistor applies a pixel signal fed to the data line to the pixel electrode in response to a scanning signal fed to the gate line.

The color filter substrate includes color filters formed for each liquid crystal cell, black matrices for dividing color filters and reflecting an external light, common electrodes for commonly applying reference voltages to the liquid crystal cells, and an alignment film coated thereon. The liquid crystal display panel is completed by preparing the thin film array substrate and the color filter substrate individually to join them and then injecting liquid crystal between them and sealing it.

In such a liquid crystal display, the thin film transistor substrate has a complicated fabrication process leading to a significant increase in manufacturing costs of the liquid crystal display panel because it involves a semiconductor process needing a plurality of mask processes. To solve this, the thin film transistor substrate has been developed toward a reduction in the number of mask processes. This is because one mask process includes a lot of processes such as thin film deposition, cleaning, photolithography, etching, photoresist stripping and inspection processes, etc. Recently, there has been highlighted a four-round mask process excluding one mask process from the existent five-round mask process that was a standard mask process of the thin film transistor.

FIG. 1 is a plan view illustrating a thin film transistor substrate adopting a four-round mask process, and FIG. 2 is a cross-sectional view of the thin film transistor substrate taken along line I-I' of FIG. 1.

Referring to FIGS. 1 and 2, the thin film transistor substrate includes a gate line 2 and a data line 4 provided on a lower substrate 42 intersecting with each other and having a gate insulating film 44 therebetween, a thin film transistor 6 provided at each intersection, and a pixel electrode 18 provided at a cell area having a crossing structure. The thin film transistor substrate further includes a storage capacitor 20 provided at an overlap portion between the pixel electrode 18 and the pre-stage gate line 2, a gate pad portion 26 connected to the gate line 2, and a data pad portion 34 connected to the data line 4.

The thin film transistor 6 allows a pixel signal applied to the data line 4 to be charged into the pixel electrode 18 and kept in response to a scanning signal applied to the gate line 2. To this end, the thin film transistor 6 includes a gate electrode 8 connected to the gate line 2, a source electrode 10 connected to the data line 4, a drain electrode 12 connected to the pixel electrode 18, and an active layer 14 overlapping the gate electrode 8 and defining a channel portion between the source electrode 10 and the drain electrode 12. Here, the active layer 14 overlaps the source electrode 10 and the drain electrode 12 to define the channel portion between the source electrode 10 and the drain electrode 12. The active layer 14 also overlaps the data line 4, a lower data pad electrode 36 and a upper storage electrode 22. On the active layer 14, an ohmic contact layer 48 for making an ohmic contact with the data line 4, the source electrode 10, the drain electrode 12, the lower data pad electrode 36, and the upper storage electrode 22 is further provided.

The pixel electrode 18 is connected, via a first contact hole 16 passing through a protective film 50, to the drain electrode 12 of the thin film transistor 6. The pixel electrode 18 generates a potential difference with respect to a common electrode provided at an upper substrate (not shown) by the charged pixel signal. This potential difference rotates a liquid crystal positioned between the thin film transistor substrate and the upper substrate owing to a dielectric anisotropy and transmits a light input, via the pixel electrode 18, from a light source (not shown) toward the upper substrate.

The storage capacitor 20 includes a pre-stage gate line 2, a upper storage electrode 22 overlapping the gate line 2 having the gate insulating film 44 wherebetween, the active layer 14 and the ohmic contact layer 48 therebetween, and the pixel electrode 18 overlapping the upper storage electrode 22 having the protective film 50 therebetween and connected via a second contact hole 24 defined at the protective film 50. The storage capacitor 20 allows a pixel signal charged in the pixel electrode 18 to be stably maintained until the next pixel voltage is charged.

The gate line 2 is connected, via the gate pad portion 26, to a gate driver (not shown). The gate pad portion 26 includes a lower gate pad electrode 28 extended from the gate line 2, and an upper gate pad electrode 32 connected, via a third contact hole 30 passing through the gate insulating film 44 and the protective film 50, to the lower gate pad electrode 28. The data line 4 is connected, via the data pad portion 34, to the data driver (not shown). The data pad portion 34 consists of a lower data pad electrode 36 extended from the data line 4, and an upper data pad electrode 40 connected, via a fourth contact hole 38 passing through the protective film 50, to the lower data pad electrode 36.

Hereinafter, a method of fabricating the thin film transistor substrate having the above-mentioned structure adopting the four-round mask process will be described in detail with reference to FIGS. 3A to 3D.

Referring to FIG. 3A, gate metal patterns including the gate line 2, the gate electrode 8 and the lower gate pad electrode 28 are formed on the lower substrate 42 by a first mask process. More specifically, a gate metal layer is formed on the lower substrate 42 by a deposition technique such as sputtering. Then, the gate metal layer is patterned by photolithography and etching processes using a first mask, thereby forming gate metal patterns including the gate line 2, the gate electrode 8 and the lower gate pad electrode 28. The gate metal layer has a single-layer or double-layer structure of chrome (Cr), molybdenum (Mo) or an aluminum group metal, etc.

Referring to FIG. 3B, the gate insulating film 44 is coated onto the lower substrate 42 provided with the gate metal patterns. Further, a semiconductor pattern including the active layer 48 and the ohmic contact layer 48 and source/drain metal patterns including the data line 4, the source electrode 10, the drain electrode 12, the lower data pad electrode 36 and the upper storage electrode 22 are provided on the gate insulating film 44 by a second mask process.

More specifically, the gate insulating film 44, an amorphous silicon layer, an n+ amorphous silicon layer and a source/drain metal layer are sequentially provided on the lower substrate 42 provided with the gate metal patterns by deposition techniques such as plasma enhanced chemical vapor deposition (PECVD) and sputtering, etc. Herein, the gate insulating film 44 is formed from an inorganic insulating material such as silicon nitride ($SiN_x$) or silicon oxide ($SiO_x$). The source/drain metal is selected from molybdenum (Mo), titanium (Ti), tantalum (Ta) or a molybdenum alloy, etc.

Then, a photo-resist pattern is formed on the source/drain metal layer by photolithography using a second mask. In this case, a diffractive exposure mask having a diffractive exposing portion at a channel portion of the thin film transistor is used as a second mask, thereby allowing a photo-resist pattern of the channel portion to have a lower height than other source/drain pattern portion. Subsequently, the source/drain metal layer is patterned by a wet etching process using the photo-resist pattern to provide the source/drain metal patterns including the data line 4, the source electrode 10, the drain electrode 12 being integral to the source electrode 10 and the upper storage electrode 22. Next, the n+ amorphous silicon layer and the amorphous silicon layer are patterned at the same time by a dry etching process using the same photo-resist pattern to provide the ohmic contact layer 48 and the active layer 14.

The photo-resist pattern having a relatively low height is removed from the channel portion by the ashing process and thereafter the source/drain metal pattern and the ohmic contact layer 48 of the channel portion are etched by the dry etching process. Thus, the active layer 14 of the channel portion is exposed to disconnect the source electrode 10 from the drain electrode 12. Then, the photo-resist pattern left on the source/drain metal pattern group is removed by a stripping process.

Referring to FIG. 3C, the protective film 50 including the first to fourth contact holes 16, 24, 30 and 38 are formed on the gate insulating film 44 provided with the source/drain metal patterns. More specifically, the protective film 50 is entirely formed on the gate insulating film 44 provided with the source/drain metal patterns by a deposition technique such as plasma enhanced chemical vapor deposition (PECVD). Then, the protective film 50 is patterned by photolithography and etching processes using a third mask to thereby define the first to fourth contact holes 16, 24, 30 and 38. The first contact hole 16 is formed through the protective film 50 to expose the drain electrode 12, whereas the second contact hole 24 is formed through the protective film 50 to expose the upper storage electrode 22. The third contact hole 30 is formed through the protective film 50 and the gate insulating film 44 to expose the lower gate pad electrode 28. The fourth contact hole 38 is formed through the protective film 50 to expose the upper data pad electrode 36. The protective film 50 is made from an inorganic insulating material identical to that of the gate insulating film 44, or an organic insulating material such as an acrylic organic compound having a small dielectric constant, BCB (benzocyclobutene) or PFCB (perfluorocyclobutane), etc.

Referring to FIG. 3D, transparent conductive film patterns including the pixel electrode 18, the upper gate pad electrode 32 and the upper data pad electrode 40 are provided on the protective film 50 by a fourth mask process. A transparent conductive film is entirely deposited onto the protective film 50 by a deposition technique such as sputtering. Then, the transparent conductive film is patterned by photolithography and etching processes using a fourth mask to provide the transparent conductive film patterns including the pixel electrode 18, the upper gate pad electrode 32, and the upper data pad electrode 40. The pixel electrode 18 is electrically connected, via the first contact hole 16, to the drain electrode 12 while being electrically connected, via the second contact hole 24, to the upper storage electrode 22 overlapping with the pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Herein, the transparent conductive film is formed from indium-tin-oxide (ITO), tin-oxide (TO) or indium-zinc-oxide (IZO).

As described above, the related art thin film transistor substrate and the fabricating method thereof as mentioned above adopts the four-round mask process, thereby simplifying the process and reducing manufacturing costs. However, because the semiconductor layer and the source/drain metal layer are patterned by a diffractive exposure mask process, the semiconductor layer remains at an unnecessary portion.

For instance, as shown in FIG. 2, the semiconductor layer including the active layer 14 and the ohmic contact layer 48 remains under the upper storage electrode 22 of the storage capacitor 20. As a result of the remaining semiconductor layer, a distance between the upper storage electrode 22 and the gate line 2 that is a lower storage electrode is far away, thereby reducing a capacitance value of the storage capacitor 20 in an inverse proportional with the distance. For this reason, the storage capacitor 20 fails to stably keep a pixel signal charged in the pixel electrode 18.

SUMMARY OF THE INVENTION

Accordingly, the present invention is directed to a thin film transistor substrate for display device and fabricating method thereof that substantially obviates one or more of the problems due to limitations and disadvantages of the related art.

An object of the present invention is to provide a thin film transistor substrate for a display device and a fabricating method thereof that are adaptive for simplifying a process by a three-round mask process as well as enlarging a capacitance value of a storage capacitor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these an other advantages and in accordance with the purpose of the present invention, as embodied and broadly described, a thin film transistor substrate for a display device comprises a gate line; a gate insulating film disposed over the gate line; a data line disposed on the gate insulating film intersecting with the gate line to define a pixel area; a thin film transistor including a gate electrode connected to the gate line, a source electrode connected to the data line, a drain electrode, and a channel between the source electrode and the drain electrode; a protective film disposed covering the gate line, the data line, and the thin film transistor; a pixel electrode connected to the drain electrode of the thin film transistor; and a storage capacitor having a first upper storage electrode connected to the pixel electrode, and a second upper storage electrode connected to the first upper storage electrode on a side surface basis via a first contact hole passing through the protective film and the first upper storage electrode at an overlapping portion of the gate line and the first upper storage electrode.

In another aspect, a method of fabricating a thin film transistor substrate for a display device, comprises the steps of forming a gate line and a gate electrode connected to the gate line; forming a gate insulating film disposed covering the gate line and the gate electrode; forming a semiconductor layer on the gate insulating film; forming a data line on the gate insulating film intersecting the gate line with the gate insulating film between the data line and the gate line to define a pixel region, a source electrode connected to the data line, a drain electrode opposed to the source electrode with the semiconductor layer therebetween, and a first upper storage electrode overlapping the gate line with the gate insulating film and the semiconductor layer therebetween; forming a protective film disposed covering the gate line, the data line, and the thin film transistor; and forming a pixel electrode connected on a side surface basis to the drain electrode and the first upper storage electrode, and a second upper storage electrode connected via a first contact hole to the first upper storage electrode on a side surface basis.

In another aspect, a method of fabricating a thin film transistor substrate for a display device, comprises forming a gate line using a first mask after forming a gate metal layer on a substrate; depositing a gate insulating film, an amorphous silicon layer, a doped amorphous silicon layer doped with an impurity and a source/drain metal layer; patterning the source/drain metal layer, the doped amorphous silicon layer, and the amorphous silicon layer using a second mask that is a partial transmitting mask, thereby providing a data line, a source electrode, a drain electrode, a semiconductor layer, and a first upper storage electrode overlapping with the gate line; forming a protective film; etching the protective film and the gate insulating film at a pixel area defined by an intersection between the gate line and a data line; forming a first contact hole through the first upper storage electrode and the semiconductor layer; and forming a pixel electrode interfacing with the protective film and being connected on a side surface basis to the drain electrode and a first upper storage electrode and forming a second upper storage electrode connected via said first contact hole to the first upper storage electrode on a side surface basis using a third mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6A and 6B are respectively a plan view and a cross-sectional view for explaining a first mask process in a method of fabricating the thin film transistor substrate of FIG. 4;

FIGS. 8A to 8D are cross-sectional views for explaining the second mask process in detail;

FIGS. 10A to 10D are cross-sectional views for explaining the third mask process in detail.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIGS. 4 to 11B.

Figure 1:
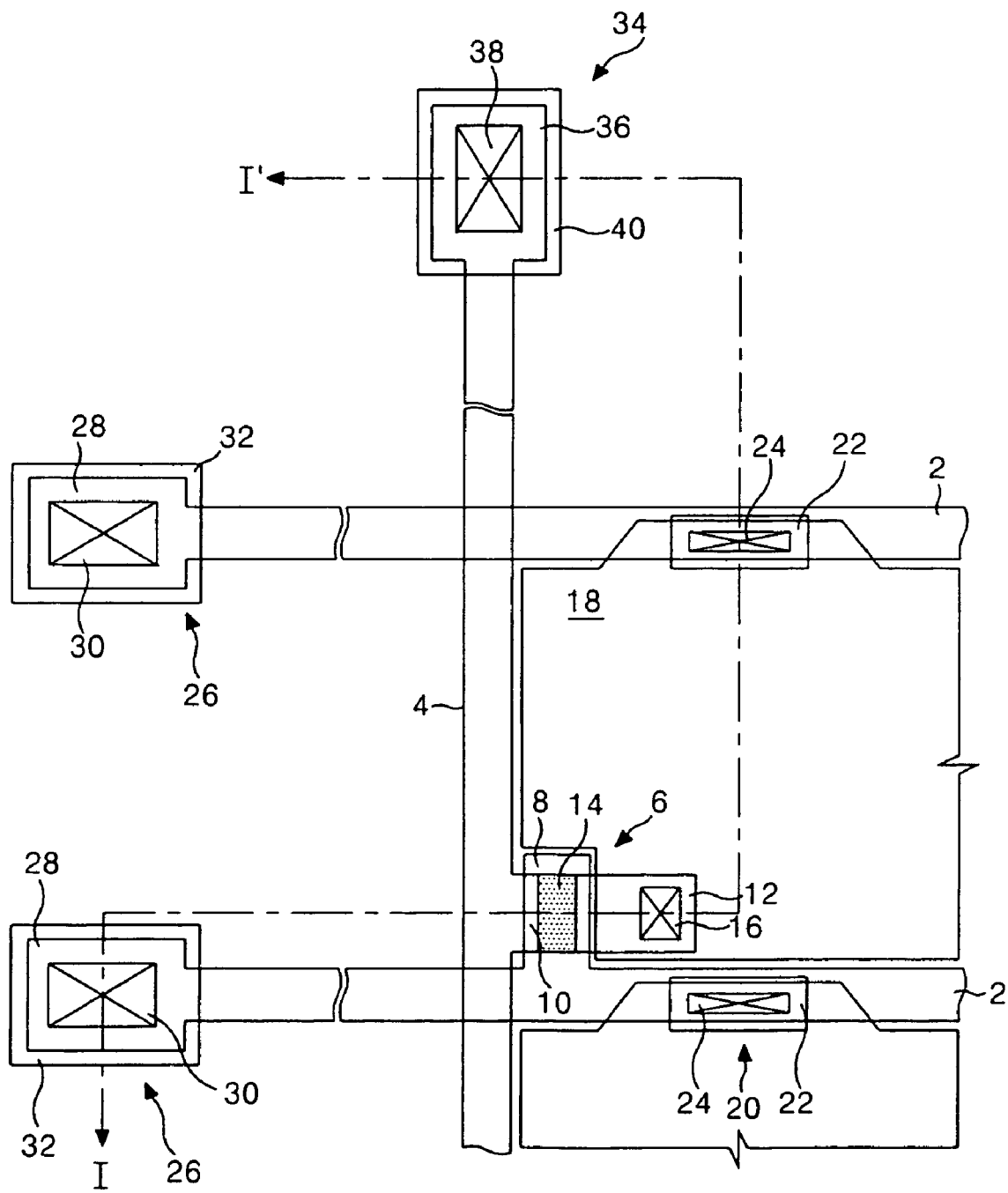
FIG. 1 is a plan view showing a portion of a related art thin film transistor substrate.
Figure 2:
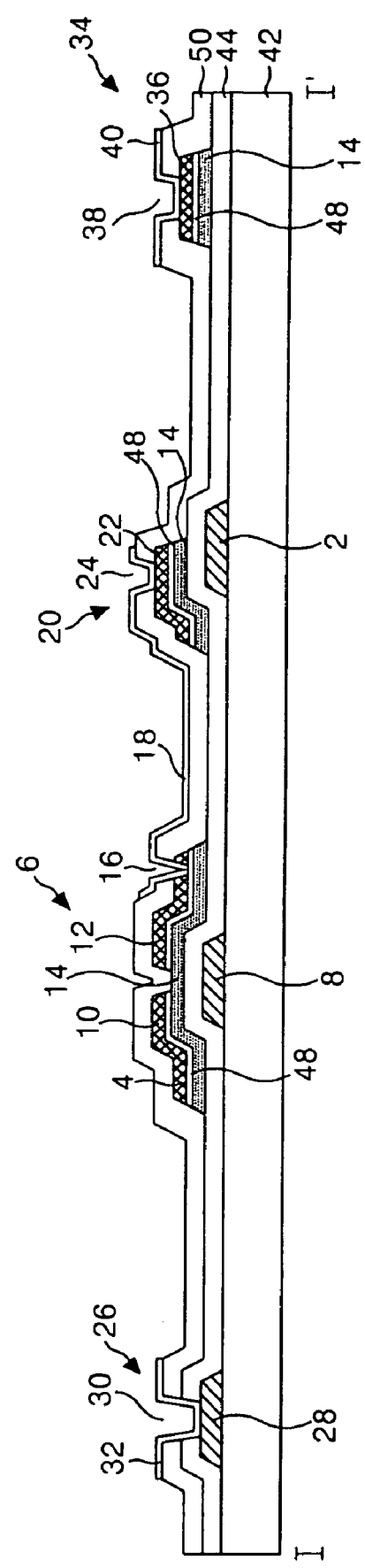
FIG. 2 is a cross-sectional view of the thin film transistor substrate taken along line I-I' of FIG. 1.
Figure 3A:
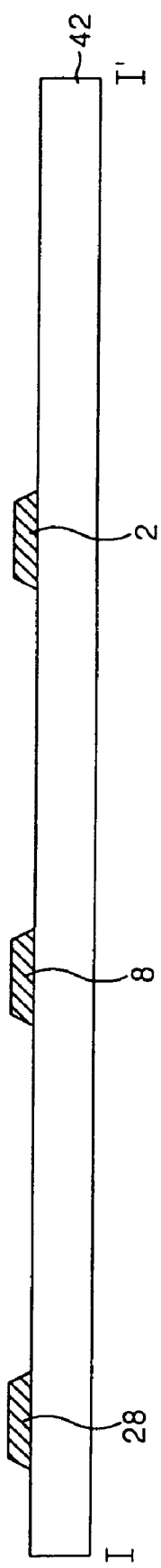
FIGS. 3A to 3D are cross-sectional views illustrating a method of fabricating the thin film transistor substrate shown in FIG. 2.
Figure 3B:
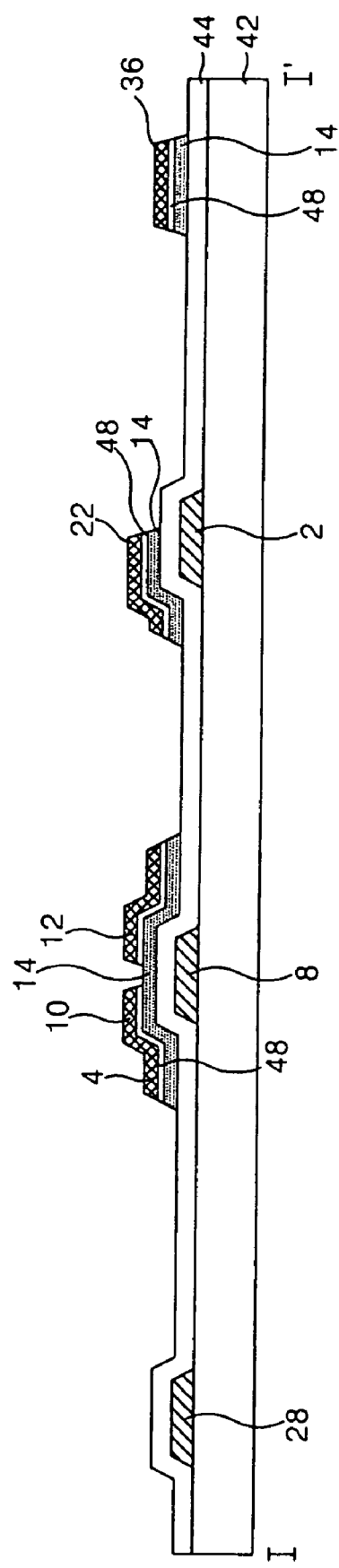
Figure 3C:
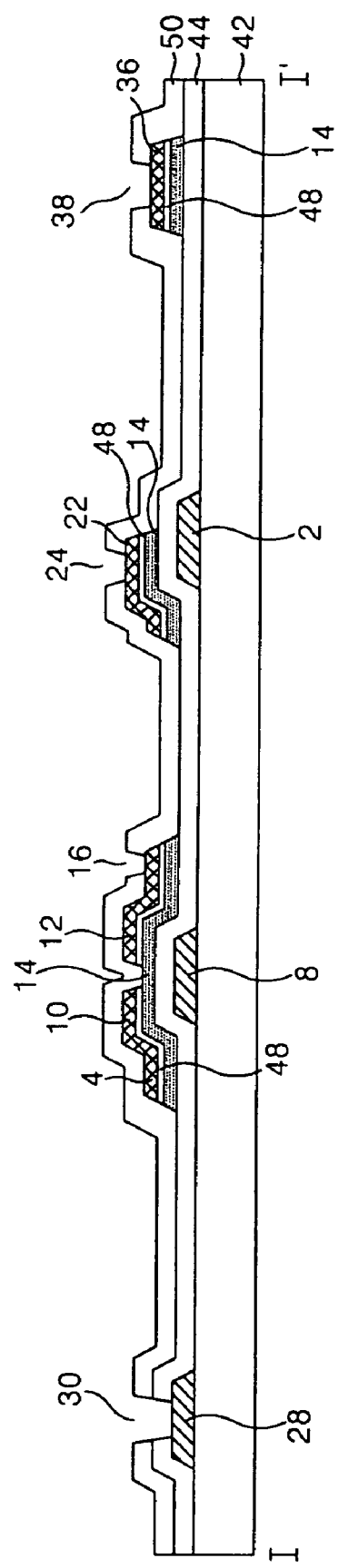
Figure 3D:
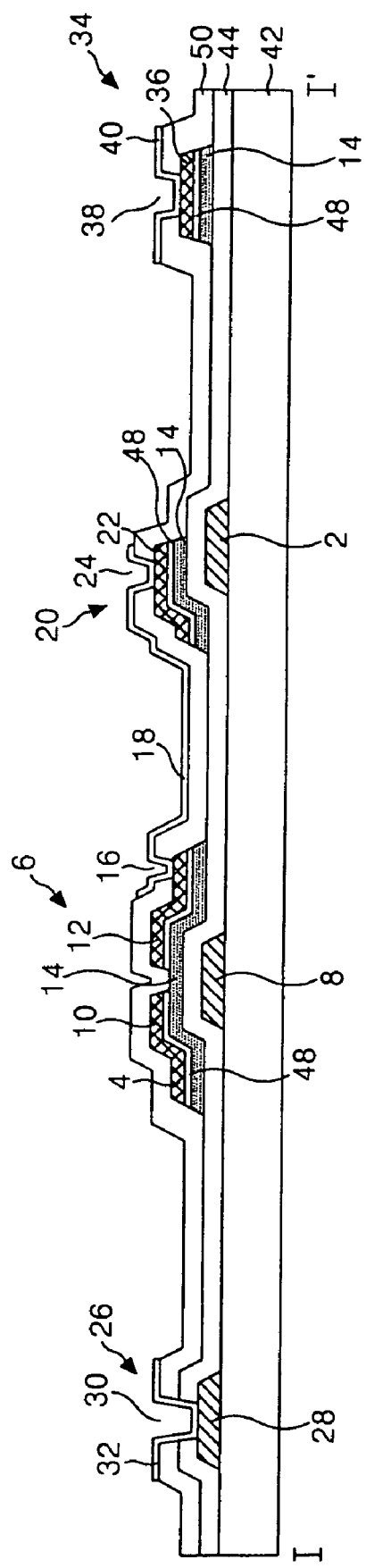
Figure 4:
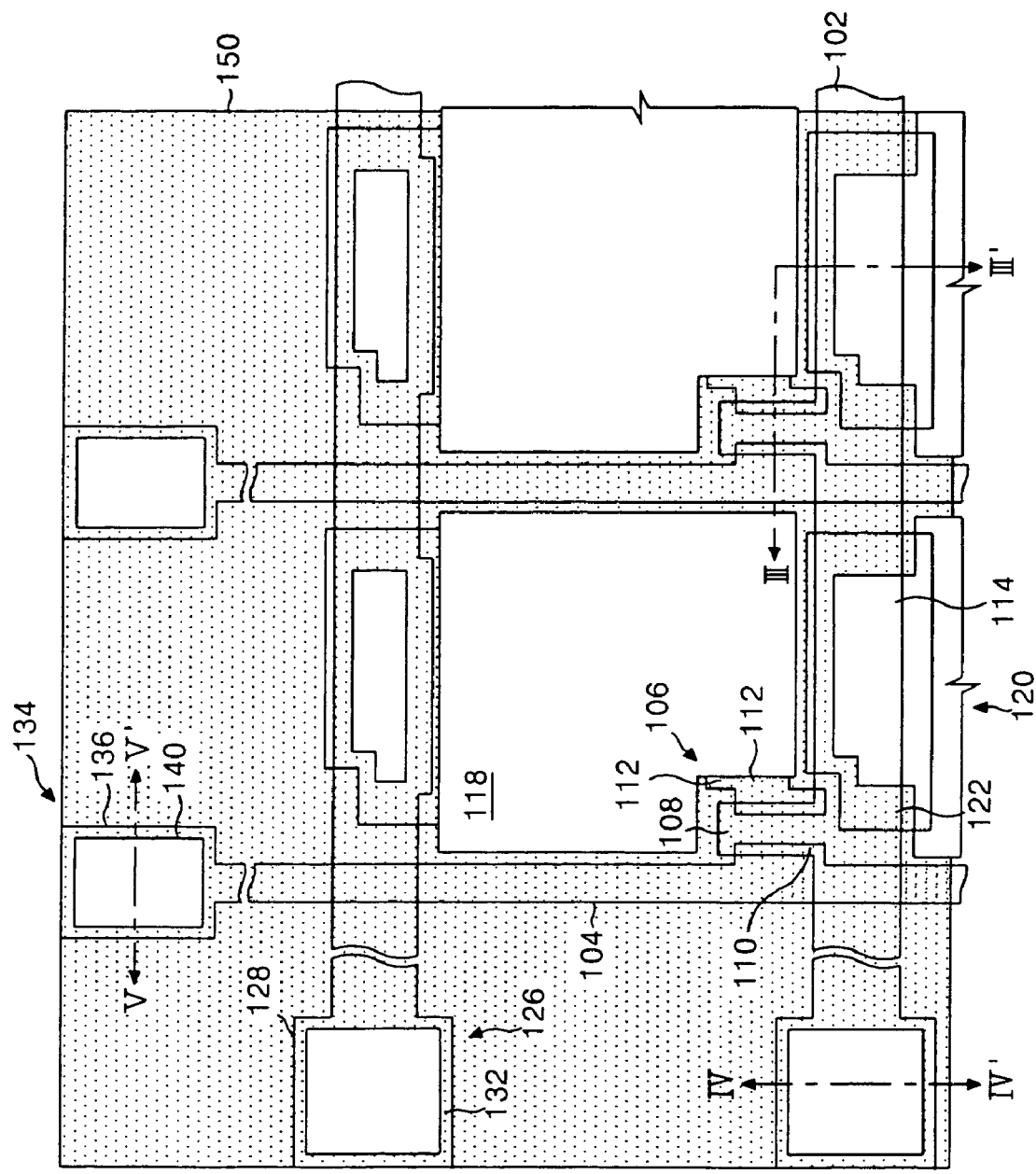
FIG. 4 is a plan view showing a portion of a thin film transistor substrate according to an exemplary embodiment of the present invention.
Figure 5:
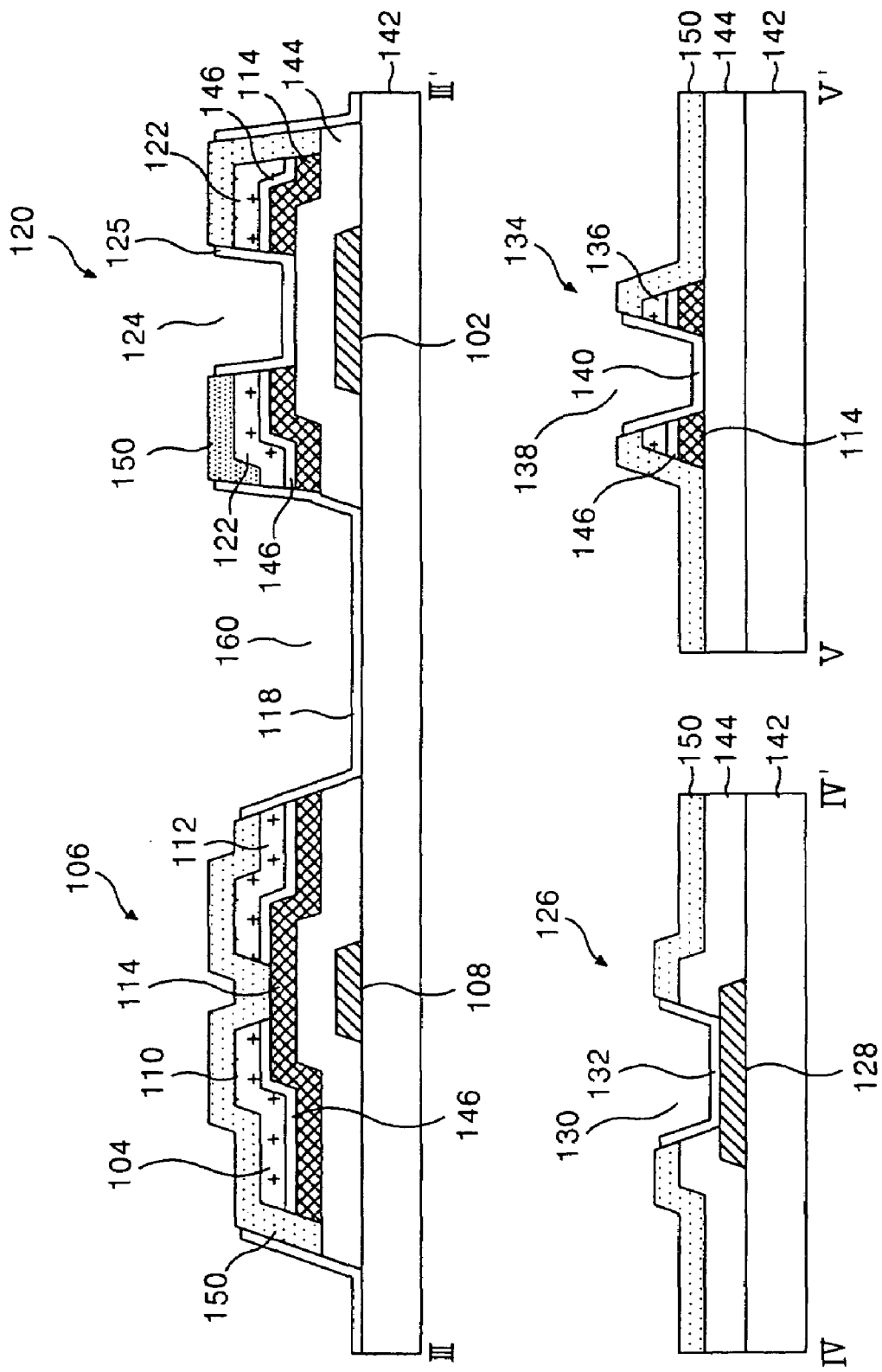
FIG. 5 is a cross-sectional view of the thin film transistor substrate taken along lines III-III', IV-IV' and V-V' of FIG. 4.

FIG. 4 is a plan view showing a portion of a thin film transistor substrate according to an exemplary embodiment of the present invention, and FIG. 5 is a cross-sectional view of the thin film transistor substrate taken along lines III-III', IV-IV' and V-V' of FIG. 4.

Referring to FIGS. 4 and 5, the thin film transistor substrate includes a gate line 102 and a data line 104 provided on a lower substrate 142 intersecting with each other and having a gate insulating film 144 therebetween, a thin film transistor 106 provided at each intersection, and a pixel electrode 118 provided at a pixel area 160 defined by the intersection structure. The thin film transistor substrate further includes a storage capacitor 120 provided at an overlapped portion between an upper storage electrode 122 connected to the pixel electrode 118 and the pre-stage gate line 102, a gate pad portion 126 connected to the gate line 102, and a data pad portion 134 connected to the data line 104.

The thin film transistor 106 allows a pixel signal applied to the data line 104 to be charged into the pixel electrode 118 and be kept in response to a scanning signal applied to the gate line 102. To this end, the thin film transistor 106 includes a gate electrode 108 connected to the gate line 102, a source electrode 110 connected to the data line 104, a drain electrode 110 positioned in opposition to the source electrode 110 to be connected to the pixel electrode 118, an active layer 114 overlapping the gate electrode 108 having the gate insulating film 144 therebetween to provide a channel between the source electrode 110 and the drain electrode 112, and an ohmic contact layer 146 formed on the active layer 114 other than the channel portion to make an ohmic contact with the source electrode 110 and the drain electrode 112. The active layer 114 and the ohmic contact layer 146 also overlap the data line 104, the lower data pad electrode 136 and a first upper storage electrode 122.

The pixel electrode 118 is connected, on a side surface basis, to the drain electrode 112 having a side surface exposed by a patterned protective (or passivation) film 150. Such a pixel electrode 118 charges a pixel signal supplied from the thin film transistor 106, thereby generating a potential difference from a common electrode provided at a color filter substrate (not shown). This potential difference rotates a liquid crystal positioned between the thin film transistor substrate and the color filter substrate owing to a dielectric anisotropy and controls an amount of light input, via the pixel electrode 118, from a light source (not shown) to be transmitted into the color filter substrate.

The storage capacitor 120 includes the pre-stage gate line 102 responsible for a lower storage electrode, and a first and second upper storage electrodes 122 and 125 overlapping the lower storage electrode and having the gate insulating film 144 therebetween. In the pre-stage gate line 102 serving as the lower storage electrode, a portion overlapping the upper storage electrode 122 is formed wider than other portion to provide a large capacitance value for storage capacitor 120. The pixel electrode 118 is connected, on a side surface basis, to the first upper storage electrode 122 having a side surface exposed by the patterned protective film 150. The second upper storage electrode 125 is connected, via a first contact hole 124 passing through the ohmic contact layer 146, the active layer 114 and the first upper storage electrode 122, to the first upper storage electrode 122, on a side surface basis, at an overlapping portion of it with the pre-stage gate line 102. Thus, the second upper storage electrode 125 preferably includes only the gate insulating film 144 between it and the gate line 102, so that a capacitance value of the storage capacitor 120 can be enlarged owing to an electrode distance reduction. The storage capacitor 120 having the above-mentioned large capacitance value allows a pixel signal charged in the pixel electrode 118 to be kept more stable until the next pixel signal is charged.

The gate line 102 is connected, via the gate pad portion 126, to a gate driver (not shown). The gate pad portion 126 comprises a lower gate pad electrode 128 extended from the gate line 102, and an upper gate pad electrode 132 connected to the lower gate pad electrode 128. Herein, the upper gate pad electrode 132 is formed within a second contact hole 130 passing through the protective film 150 and the gate insulating film 144 to be connected to the lower gate pad electrode 128.

The data line 104 is connected, via a data pad portion 134, to a data driver (not shown). The data pad portion 134 comprises a lower data pad electrode 136 extended from the data line 104, and an upper data pad electrode 140 connected, on a side surface basis, to the lower data pad electrode 136. Herein, the upper data pad electrode 140 is formed within a third contact hole 138 passing through the protective film 150, the lower data pad electrode 136, the ohmic contact layer 146 and the active layer 114 to be connected to the side surface of the lower data pad electrode 136.

In the thin film transistor substrate having the above-mentioned structure, a transparent conductive pattern including the pixel electrode 118, the upper gate pad electrode 132 and the upper data pad electrode 140 is formed by the same transparent conductive layer patterning process. In this case, the transparent conductive layer is patterned by a lift-off process of removing a photo-resist pattern used upon patterning of the protective film 150 and the gate insulating film 144. Thus, the transparent conductive pattern makes an interface with the protective film 150. Meanwhile, the patterned gate insulating film 144 has the same shape as the patterned protective film 150 except for a lower portion of the lower data pad electrode 136. The thin film transistor substrate according to this exemplary embodiment of the present invention can reduce the number of mask processes by the following three-round mask process owing to an application of the lift-off process.

FIGS. 6A and 6B are respectively a plan view and a cross-sectional view for explaining a first mask process in a method of fabricating the thin film transistor substrate of FIG. 4.

A gate metal pattern including the gate line 102, the gate electrode 106 connected to the gate line 102 and the lower gate pad electrode 128 is formed on the lower substrate 142 by the first mask process. More specifically, a gate metal layer is formed on the lower substrate 142 by a deposition technique such as sputtering. Then, the gate metal layer is patterned by photolithography and etching processes using a first mask to provide the gate metal pattern including the gate line 102, the gate electrode 108, and the lower gate pad electrode 128. Herein, the gate metal is made from Cr, MoW, Cr/Al, Cu, Al(Nd), Mo/Al, Mo/Al(Nd) or Cr/Al(Nd), etc.

Figure 7A:
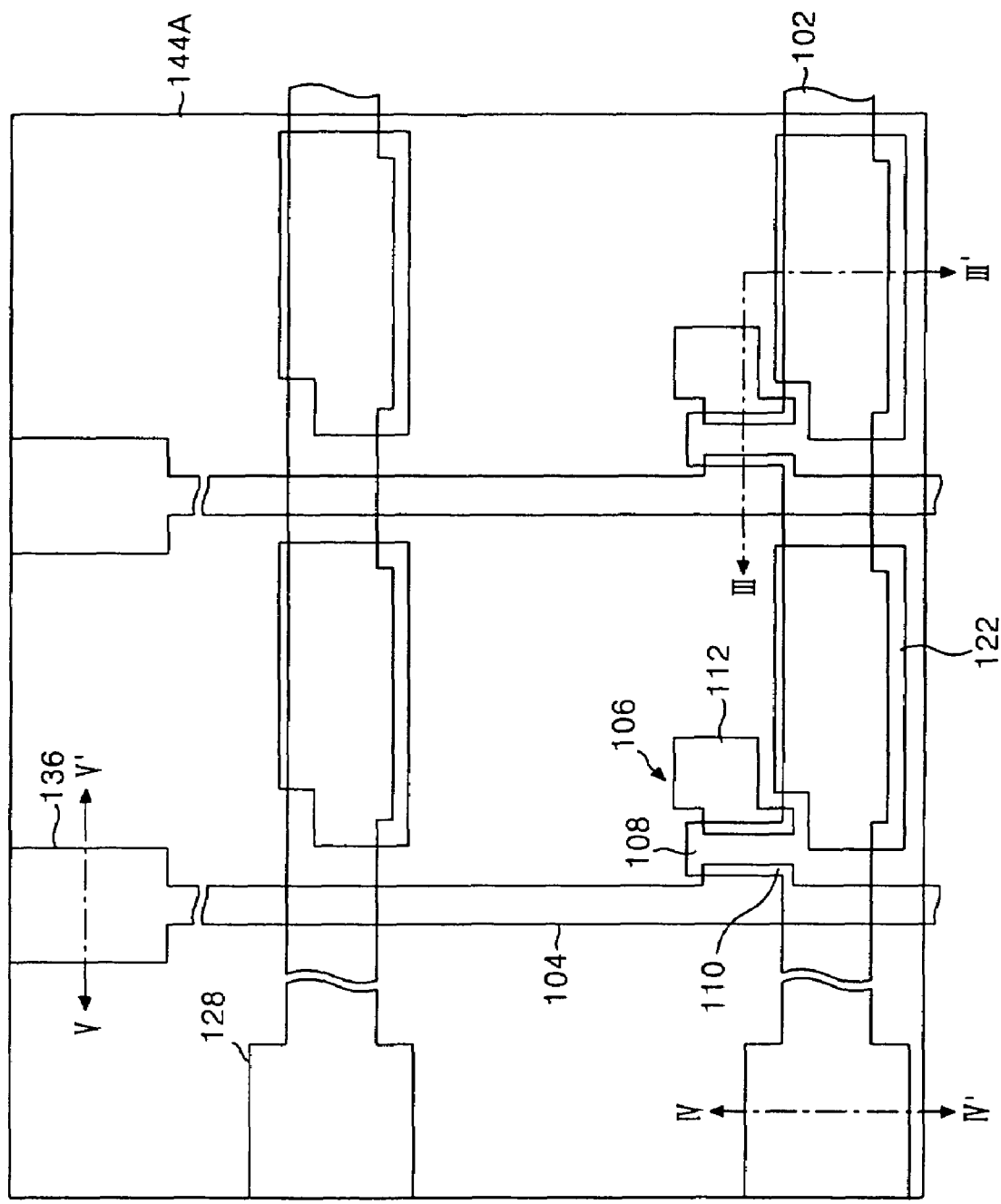
FIGS. 7A and 7B are respectively a plan view and a cross-sectional view for explaining a second mask process in a method of fabricating the thin film transistor substrate of FIG. 4.
Figure 7B:
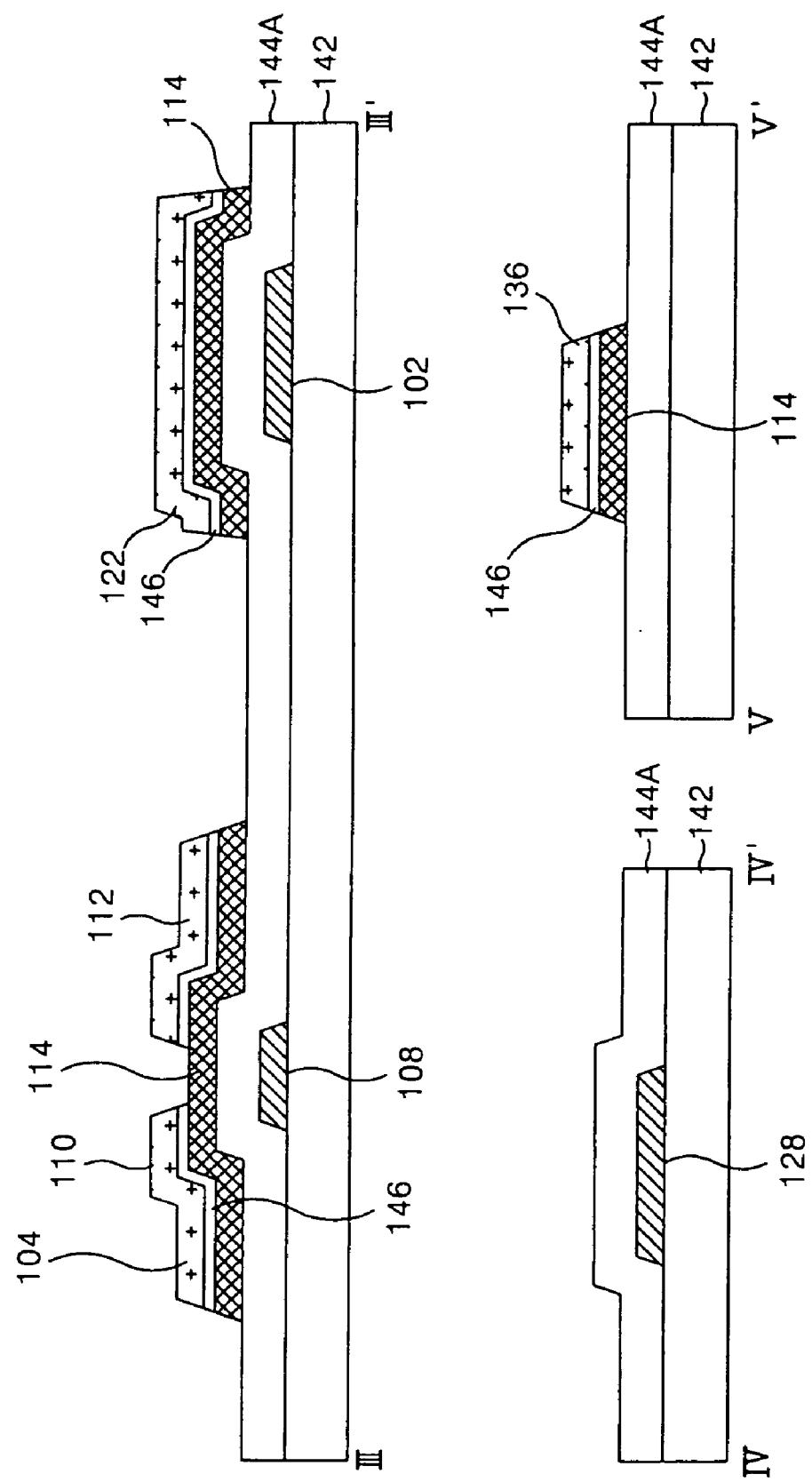

FIGS. 7A and 7B are respectively a plan view and a cross-sectional view for explaining a second mask process in a method of fabricating the thin film transistor substrate of FIG. 4, and FIGS. 8A to 8D are cross-sectional views for explaining the second mask process in detail.

First, an entire gate insulating film 144A is formed on the lower substrate 142 provided with the gate metal pattern by a deposition technique such as PECVD or sputtering. The gate insulating film 144A is formed from an inorganic insulating material such as silicon nitride ($SiN_x$) or silicon oxide ($SiO_x$).

Further, a semiconductor pattern including the active layer 114 and the ohmic contact layer 146 disposed on the entire gate insulating film 144A; and a source/drain metal pattern including the data line 104, the source electrode 110, the drain electrode 112, the lower data pad electrode 136 and the first upper storage electrode 122 overlapping the gate line 102 are formed by the second mask process.

More specifically, as shown in FIG. 8A, an amorphous silicon layer 114A, an $n^+$ amorphous silicon layer 146A and a source/drain metal layer 105 are sequentially formed on the entire gate insulating film 144A by a deposition technique such as PECVD or sputtering. The source/drain metal is made from Cr, MoW, Cr/Al, Cu, Al(Nd), Mo/Al, Mo/Al(Nd) or Cr/Al(Nd), etc. Subsequently, a photo-resist is entirely coated onto the source/drain metal layer 105 and then a photo-resist pattern 148 having a step coverage as shown in FIG. 8A is formed by photolithography using a second mask that is a partial exposure mask. In this case, the second mask employs a partial exposure mask that has a diffractive exposure portion (or transflective portion) where a channel of the thin film transistor is to be formed. Thus, the photo-resist pattern 148 corresponding to the diffractive exposure portion (or transflective portion) has a lower height than the photo-resist pattern 148 corresponding to the transmissive portion (or shielding portion) of the second mask. In other words, the photo-resist pattern 148 of the channel portion has a lower height than the photo-resist pattern 148 of other source/drain metal pattern portion.

Figure 8B:
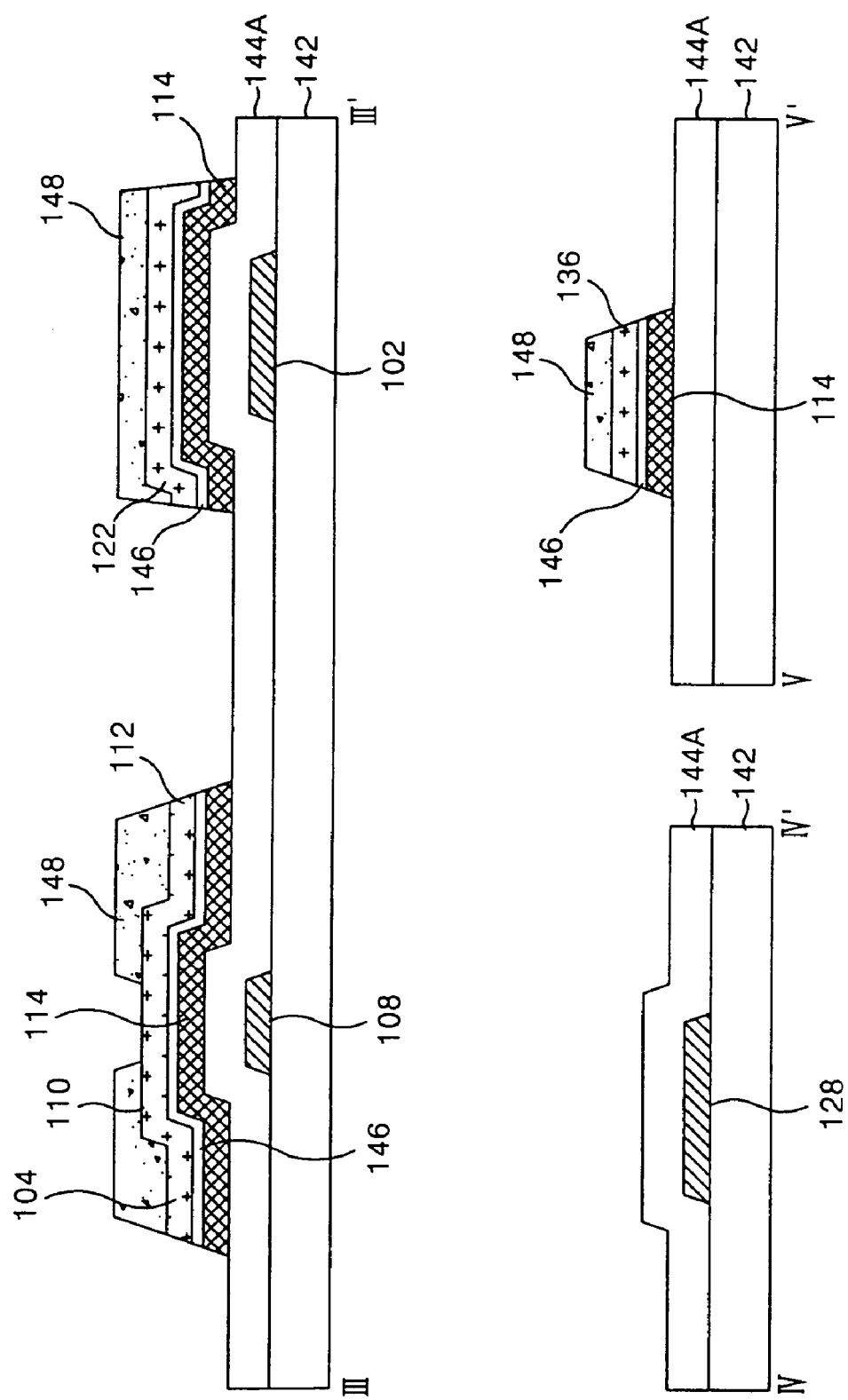

The source/drain metal layer 105 is patterned by a wet etching process using the photo-resist pattern 148 to provide a source/drain metal pattern including the data line 104, the source electrode 110 of the thin film transistor portion, the drain metal pattern 112 integral to the source electrode 110 and the first upper storage electrode 122 overlapping with the gate line 102 as shown in FIG. 8B. Further, the n$^+$ amorphous silicon layer 114A and the amorphous silicon layer 146A are simultaneously patterned by a dry etching process using the same photo-resist pattern 148 to have a structure in which the ohmic contact layer 146 and the active layer 114 are formed along the source/drain metal pattern as shown in FIG. 8B.

Figure 8C:
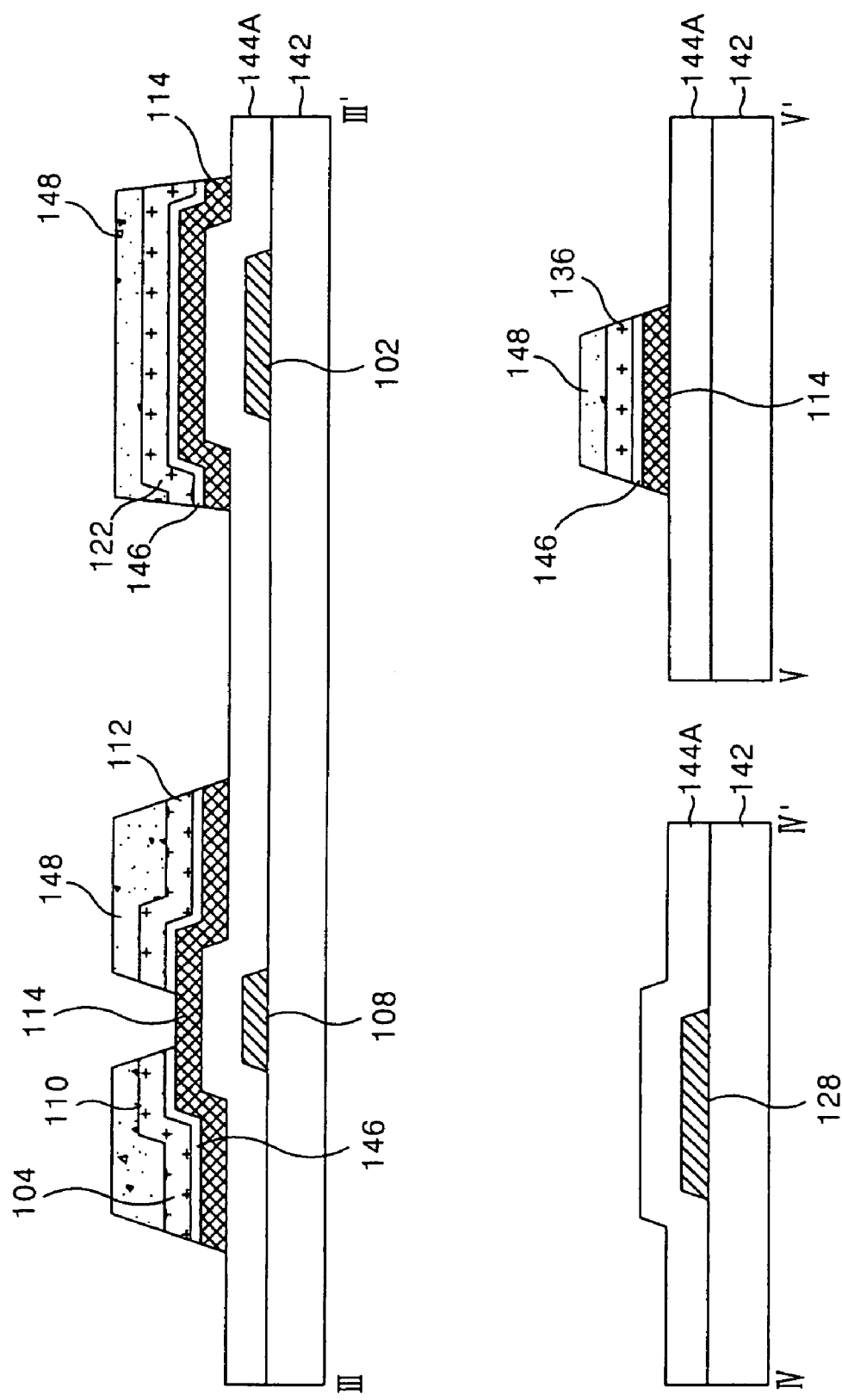

Next, the photo-resist pattern 148 at the channel portion having a relatively low height is removed by an ashing process using oxygen (O$_2$) plasma as shown in FIG. 8C, whereas the photo-resist pattern 148 at other source/drain metal pattern portion has a lowered height.

As shown in FIG. 8D, the source/drain metal pattern and the ohmic contact layer 146 are etched from a portion at which a channel is to be defined by a dry etching process using the photo-resist pattern 148 left in this manner, thereby disconnecting the source electrode 110 from the drain electrode 112 and exposing the active layer 114. Thus, a channel formed from the active layer 154 is provided between the source electrode 110 and the drain electrode 112. Further, the photo-resist pattern 148 having been left at the source/drain metal pattern portion is entirely removed by the stripping process.

Figure 9A:
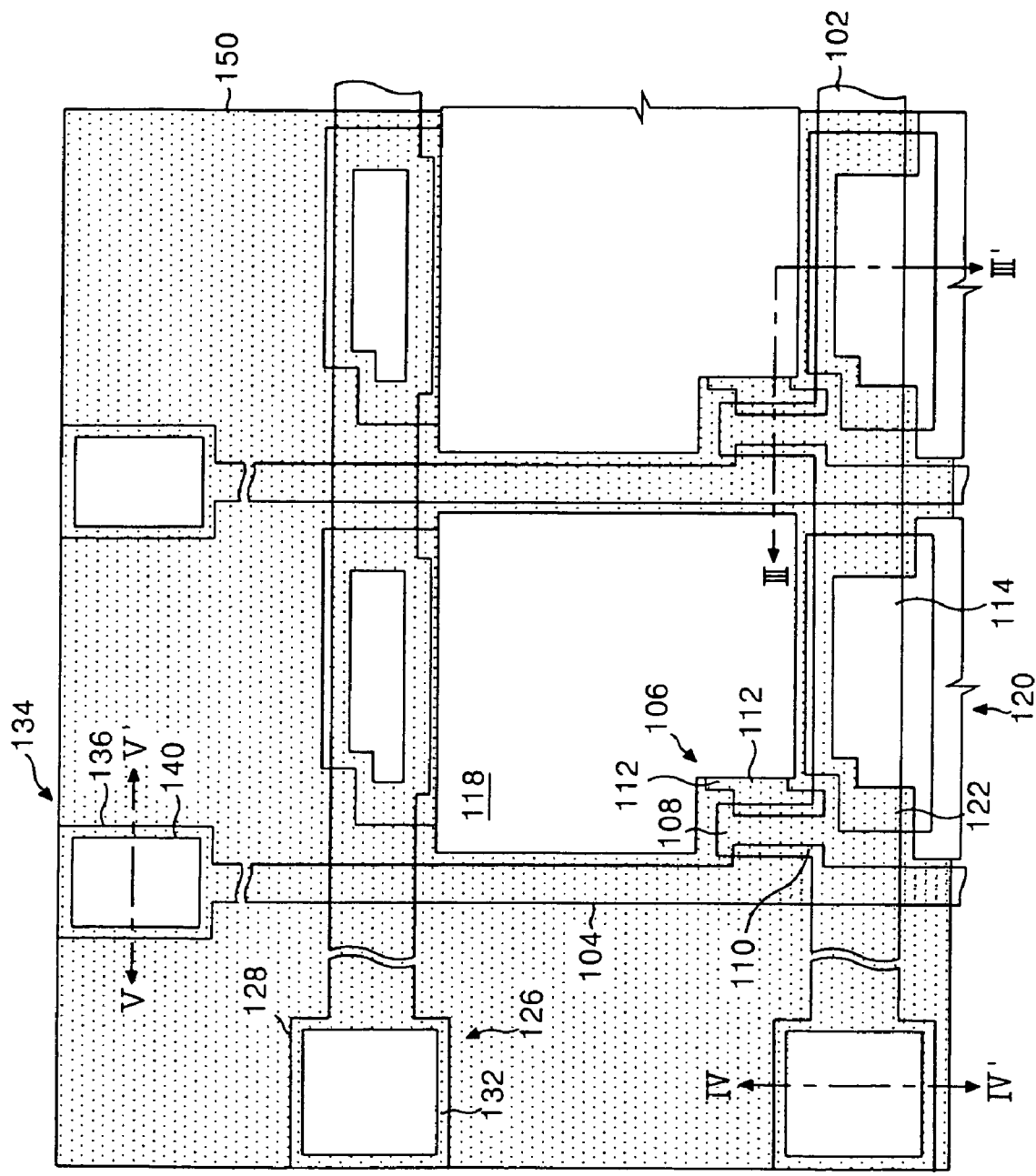
FIGS. 9A and 9B are respectively a plan view and a cross-sectional view for explaining a third mask process in a method of fabricating the thin film transistor substrate of FIG. 4.
Figure 9B:
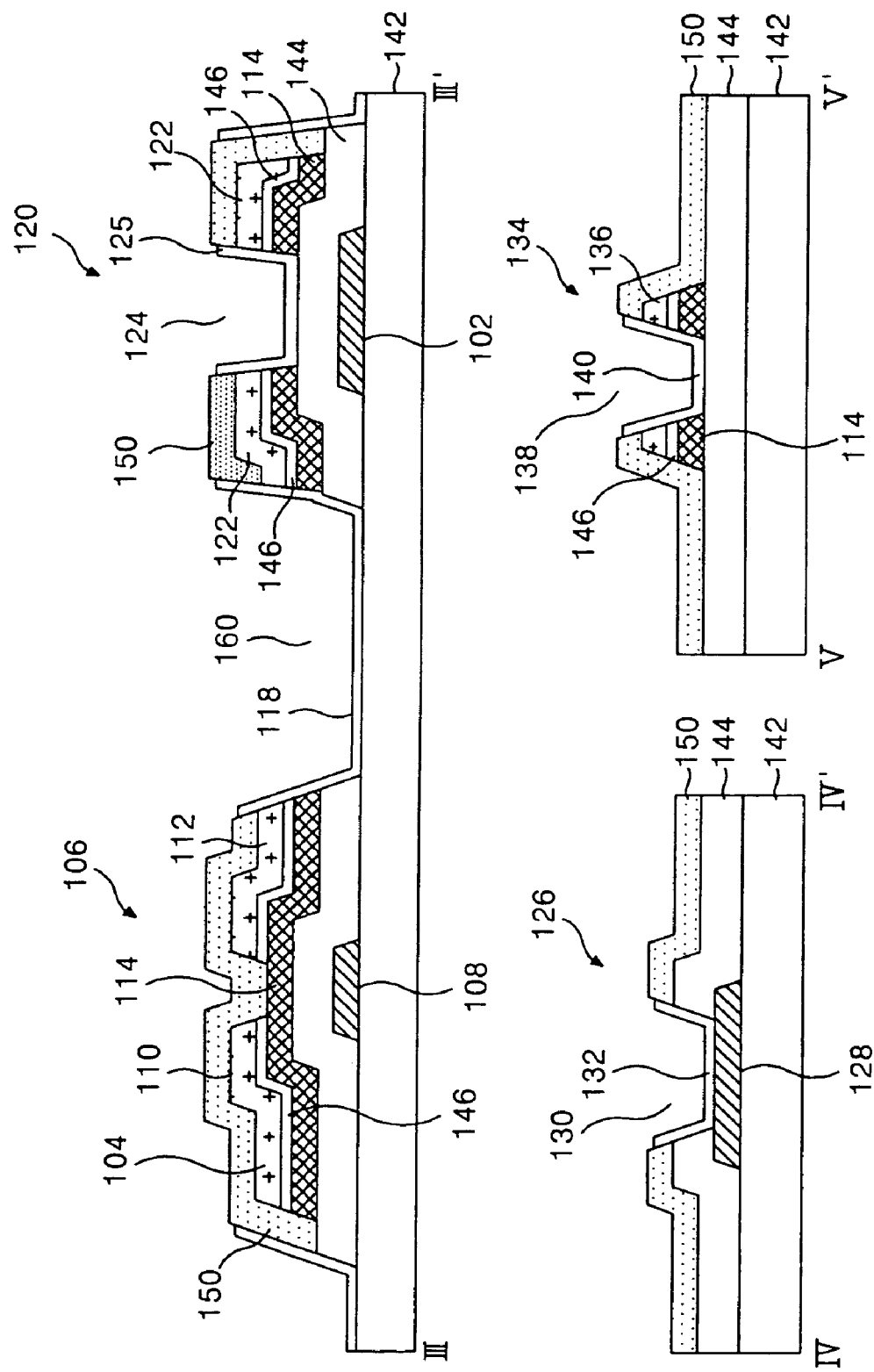

FIGS. 9A and 9B are respectively a plan view and a cross-sectional view for explaining a third mask process in a method of fabricating the thin film transistor substrate of FIG. 4, and FIGS. 10A to 10D are cross-sectional views for explaining the third mask process in detail.

While the entire protective film 150A and the gate insulating film 144A being patterned by a third mask process, the first contact hole 125 is defined at an overlapping portion between the first upper storage electrode 122 and the gate line 102 and then a transparent conductive pattern including the pixel electrode 118, the upper gate pad electrode 132, the upper data pad electrode 140 and the second upper storage electrode 125 is provided. Herein, the transparent conductive pattern makes an interface with the patterned protective film 150 without any overlapping portion.

Figure 10A:
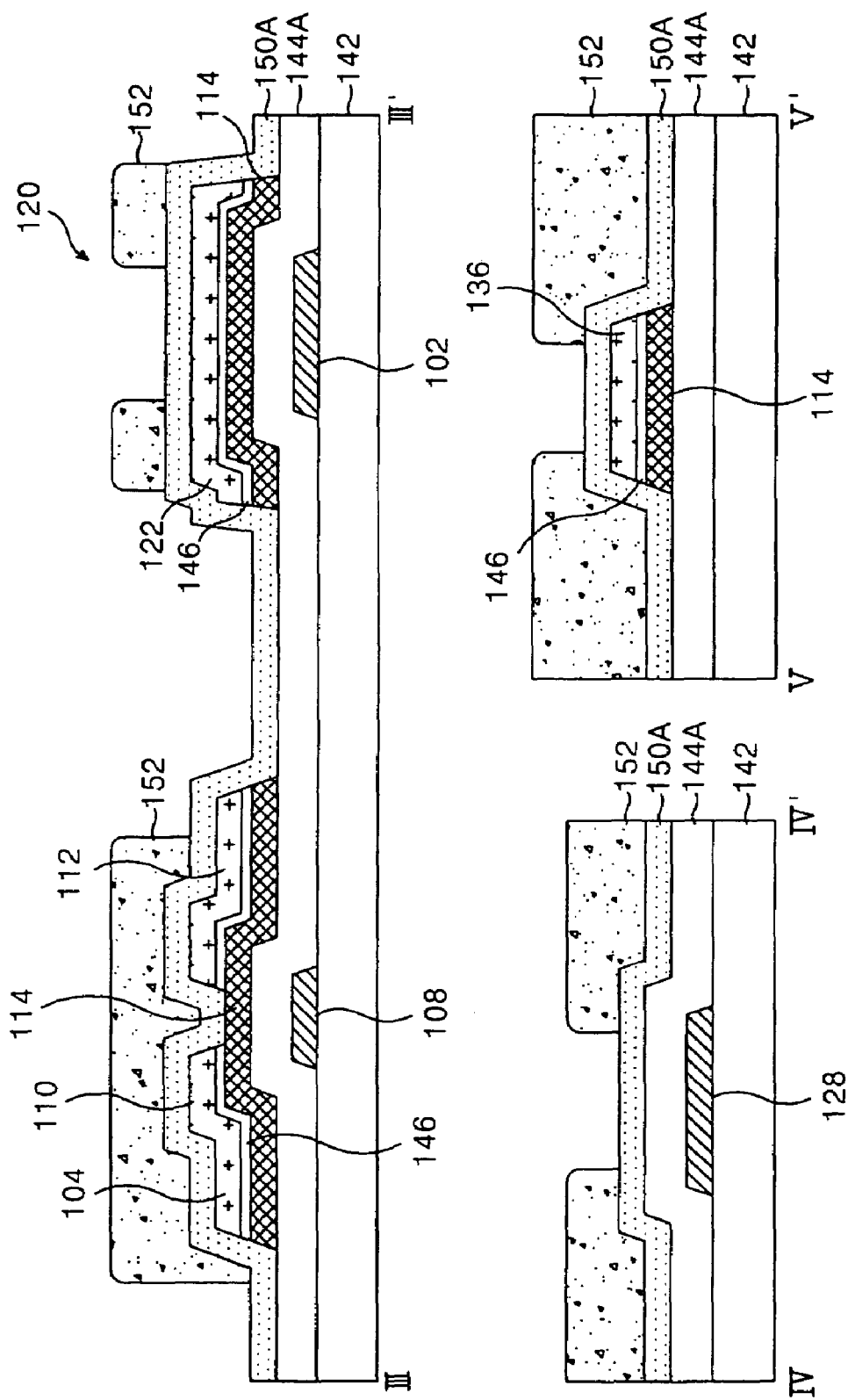

More specifically, the entire protective film 150A is formed on the entire gate insulating film 144A provided with the source/drain metal pattern as shown in FIG. 10A. The protective film 150A is made from an inorganic insulating material or an organic insulating material similar to the gate insulating film 144A. Further, the photo-resist pattern 152 is formed on the entire protective film 150A at a portion where the protective film 150A is to be provided, as shown in FIG. 10A, using photolithography using a third mask.

Figure 10B:
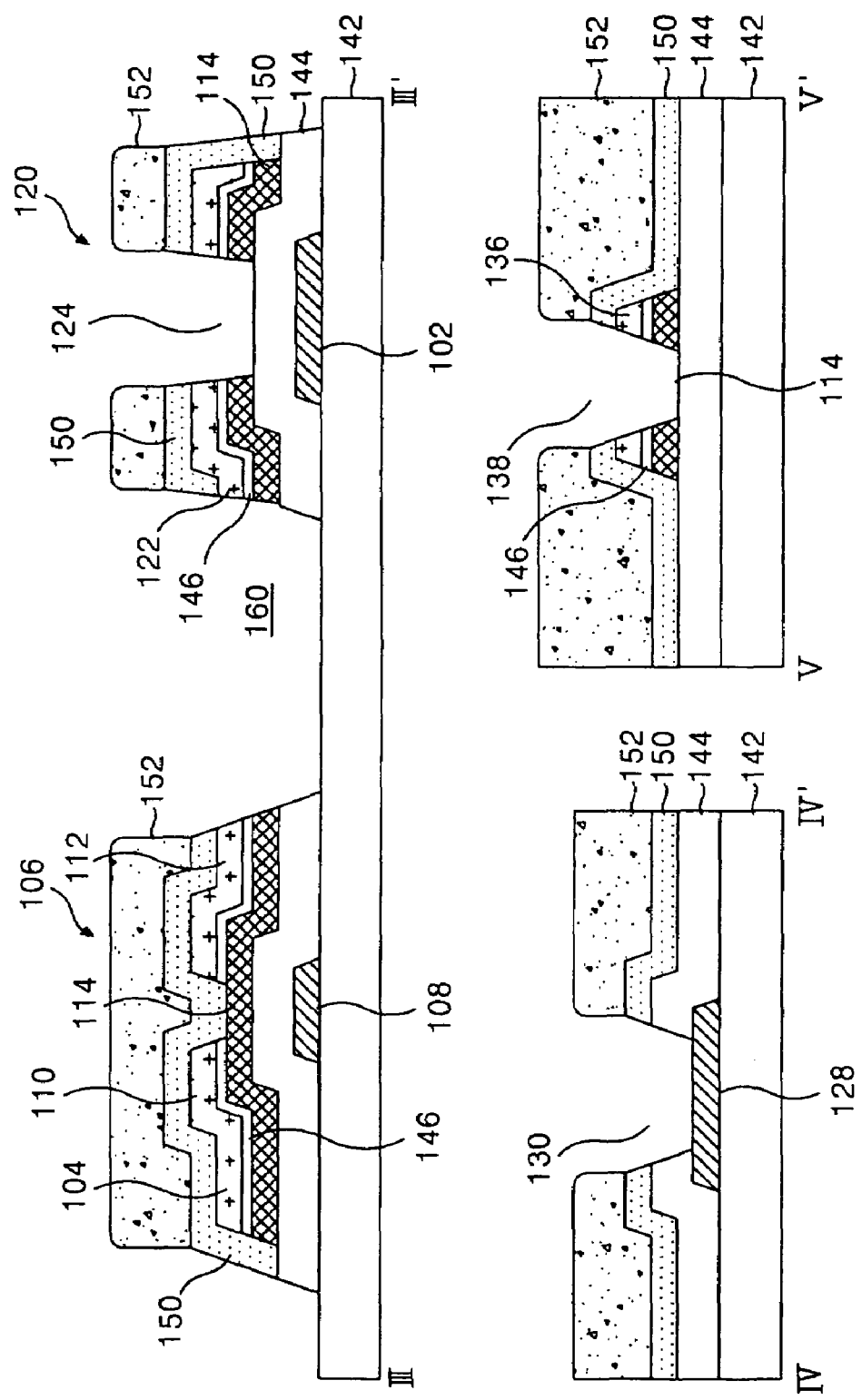

Then, the entire protective film 150A and the gate insulating film 144A are patterned by the etching process using the photo-resist pattern 152 to leave the protective film 150 and the gate insulating film 144 at the remaining area other than an area where the transparent conductive patterns are to be formed as shown in FIG. 10B. More specifically, a substrate 142 is exposed at the pixel area where the pixel electrode is to be formed by the patterned protective film 150 and the gate insulating film 144. At this time, portions of the drain electrode 112 and the first upper storage electrode 122 that do not overlap the photo-resist pattern 152, the ohmic contact layer 146 and the active layer 114 under them are etched along with the protective film 150, thereby exposing the side surfaces thereof. The storage capacitor 120 is provided with the first contact hole 124 passing through the protective film 150, the first lower storage electrode 122, the ohmic contact layer 146 and the active layer 114, thereby exposing the side surface of the first upper storage electrode 122. Further, the lower gate pad electrode 128 is exposed through the second contact hole 130 passing through the protective film 150 and the gate insulating film 144 from the gate pad portion. The side surface of the lower data pad electrode 136 is exposed through the third contact hole 138 passing through the protective film 150, the lower data pad electrode 136, the ohmic contact layer 146 and the active layer 114 from the data pad portion.

Figure 10C:
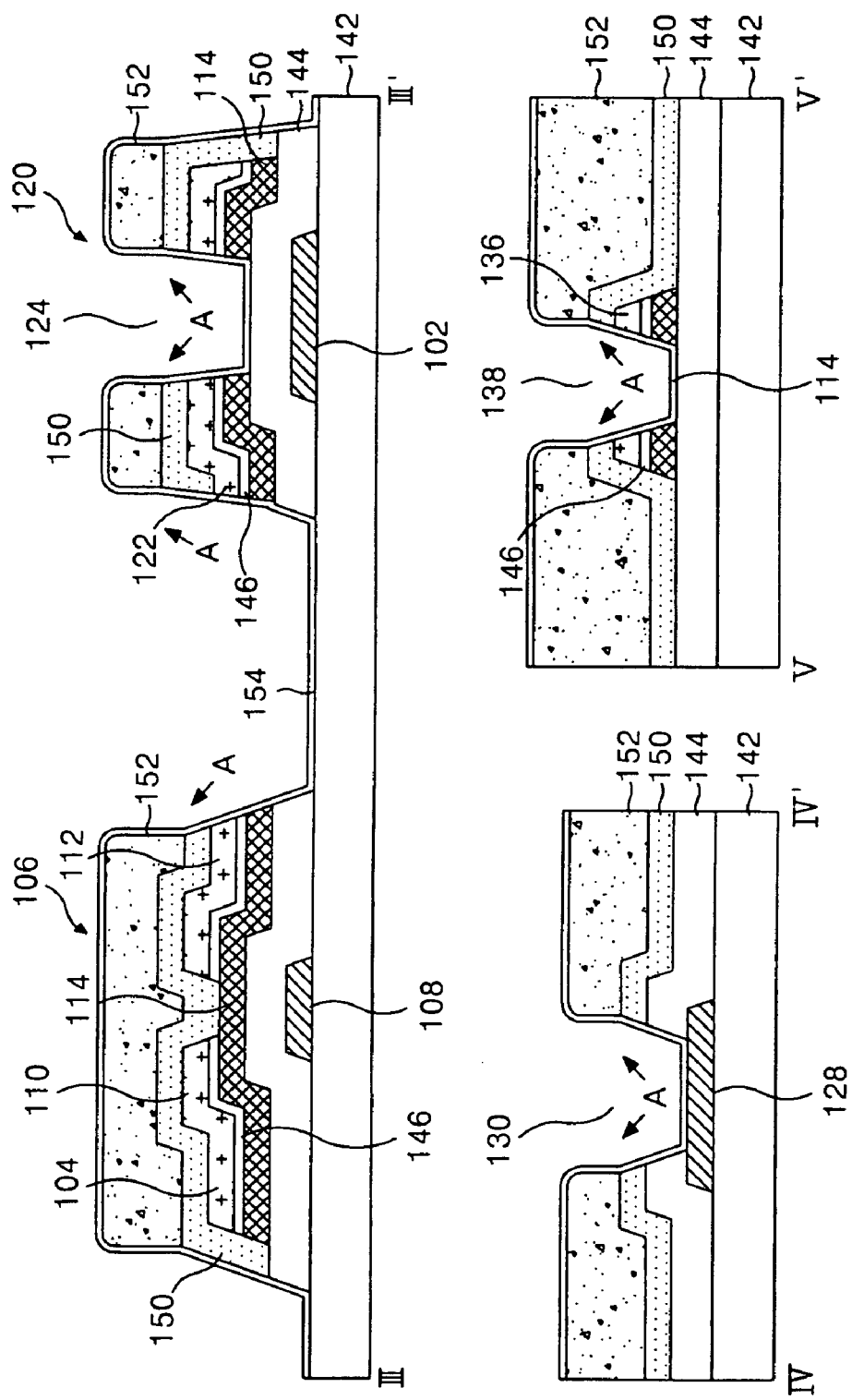

Subsequently, the transparent conductive film 154 is entirely formed on the thin film transistor substrate in which the photo-resist pattern 152 exists as shown in FIG. 10C by a deposition technique such as sputtering. The transparent conductive film 154 is formed from indium-tin-oxide (ITO), tin-oxide (TO), indium-zinc-oxide (IZO), SnO$_2$ or the like.

Then, the photo-resist pattern 152 and the transparent conductive film 154 thereon are simultaneously removed by a lift-off process to pattern the transparent conductive film 154. Thus, the transparent conductive pattern including the pixel electrode 118, the upper gate pad electrode 132, the upper data pad electrode 140 and the second upper storage electrode 125 is provided as shown in FIG. 10D. Such a transparent conductive pattern makes an interface with the patterned protective film 150 without any overlapping portion.

More specifically, the pixel electrode 118 makes an interface with the protective film 150 patterned to cover the gate line 102, the data line 104 and the thin film transistor 196 at the pixel area, thereby being connected, on a side surface basis, to the first upper storage electrode 122. The upper gate pad electrode 132 makes an interface with the protective film 150 within the second contact hole 130 to be connected to the exposed lower gate pad electrode 128. The upper data pad electrode 132 makes an interface with the protective film 150 within the third contact hole 138 to be connected, on a side surface basis, to the lower data pad electrode 136.

As mentioned above, in the method of fabricating the thin film transistor according to the embodiment of the present invention, the transparent conductive layer is patterned by the lift-off process, thereby permitting a fabrication of the thin film transistor substrate by the three-round mask process. Particularly, in the storage capacitor 120 of the present embodiment, a distance between the second upper storage electrode 125 and the gate line 102 is reduced by the first contact hole 124 passing through the ohmic contact layer 146, the active layer 114 and the first upper storage electrode 122 so that a capacitance value thereof can be enlarged. The present invention, the lift-off process is applied to simplify the process by the three-round mask process, thereby reducing the manufacturing cost as well as improving the production yield. Furthermore, according to the present invention, a distance between the second upper storage electrode and the gate line can be reduced by the contact hole provided at the first upper storage electrode besides the reduction in the number of processes, thereby enlarging a capacitance value of the storage capacitor.

It will be apparent to those skilled in the art that various modifications and variations can be made in the thin film transistor substrate for display device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor substrate for a display device, comprising the steps of:
   forming a gate line and a gate electrode connected to the gate line;
   forming a gate insulating film disposed covering the gate line and the gate electrode;
   forming a semiconductor layer a on the gate insulating film;
   forming a data line on the gate insulating film intersecting the gate line with the gate insulating film between the data line and the gate line to define a pixel region, a source electrode connected to the data line, a drain electrode opposed to the source electrode with the semiconductor layer therebetween, and a first upper storage electrode overlapping the gate line with the gate insulating film and the semiconductor layer therebetween;
   forming a protective film disposed covering the gate line, the data line, and the thin film transistor; and
   forming a pixel electrode connected on a side surface basis to the drain electrode and the first upper storage electrode, and a second upper storage electrode connected via a first contact hole to the first upper storage electrode on a side surface basis.

2. The method as claimed in claim 1, further comprising the steps of:
   forming a lower gate pad electrode connected to the gate line when forming the gate line;
   defining a second contact hole through the gate insulating film and the protective film to expose a portion of the lower gate pad electrode; and
   forming an upper gate pad electrode connected to the lower gate pad electrode through the second contact hole.

3. The method as claimed in claim 2, further comprising the steps of:
   forming a lower data pad electrode connected to the data line when forming the data line;
   defining a third contact hole passing through the protective film and the lower data pad electrode to expose a portion of the lower data pad electrode; and
   forming an upper data pad electrode connected on a side surface basis to the lower data pad electrode through the third contact hole.

4. A method of fabricating a thin film transistor substrate for a display device, comprising:
   forming a gate line using a first mask after forming a gate metal layer on a substrate;
   depositing a gate insulating film, an amorphous silicon layer, a doped amorphous silicon layer doped with an impurity and a source/drain metal layer;
   patterning the source/drain metal layer, the doped amorphous silicon layer, and the amorphous silicon layer using a second mask that is a partial transmitting mask, thereby providing a data line, a source electrode, a drain electrode, a semiconductor layer, and a first upper storage electrode overlapping with the gate line;
   forming a protective film;
   etching the protective film and the gate insulating film at a pixel area defined by an intersection between the gate line and a data line using a third mask;
   forming a first contact hole through the first upper storage electrode and the semiconductor layer using the third mask; and
   forming a pixel electrode interfacing with the protective film and being connected on a side surface basis to the drain electrode and a first upper storage electrode and forming a second upper storage electrode connected via said first contact hole to the first upper storage electrode on a side surface basis using the third mask.

5. The method as claimed in claim 4, wherein the patterning step includes the steps of:
   forming a different thickness of photo-resist patterns on the source/drain metal layer using the partial transmitting mask;
   patterning the source/drain metal layer, the doped amorphous silicon layer and the amorphous silicon layer using said photo-resist patterns to provide the data line, the drain electrode integral to the source electrode, a first storage electrode and the semiconductor layer;
   ashing the photo-resist patterns to remove a relatively thin photo-resist pattern;
   disconnecting the source electrode from the drain electrode by a portion at which the relatively thin photo-resist pattern is removed, and removing the doped amorphous silicon layer; and
   removing the residual photo-resist pattern.

6. The method as claimed in claim 4, wherein the steps of etching the protective film and the gate insulating film, forming the first contact hole, and forming the pixel electrode and the second upper storage electrode include the steps of:
   forming a photo-resist pattern on the protective film;
   using the photo-resist as the third mask, etching the protective film and the gate insulating film at the pixel area and the protective film to define said first contact hole;
   forming a transparent conductive film on the protective film where the photo-resist pattern remains; and
   removing the photo-resist pattern and the transparent conductive film thereon by a lift-off process to provide the pixel electrode and the second upper storage electrode.

7. The method as claimed in claim 6, wherein the steps of etching the protective film and the gate insulating film and forming the first contact hole include etching portions of the drain electrode, the first upper storage electrode, and the semiconductor layer outside of the photo-resist pattern.

8. The method as claimed in claim 4, wherein the step of forming a gate line includes the step of forming a lower gate pad electrode connected to the gate line; and
   wherein the steps of forming the first contact hole and forming the pixel electrode and the second upper storage electrode include the steps of forming a second contact hole through the protective film and the gate insulating film to expose a portion of the lower gate pad electrode, and forming an upper gate pad electrode connected to the lower gate pad electrode through the second contact hole.

9. The method as claimed in claim 4, wherein the patterning step includes the step of forming a lower data pad electrode connected to the data line and the semiconductor layer; and wherein the steps of forming the first contact hole and forming the pixel electrode and the second upper storage electrode includes the steps of forming a third contact hole passing through the protective film, the lower data pad electrodes and the semiconductor layer, and forming an upper data pad electrode connected on a side surface basis to the lower data pad electrode through the third contact hole along with the pixel electrode.

10. The method as claimed in claim 9, wherein the protective film interfaces with the pixel electrode, the second upper storage electrode, the upper gate pad electrode and the upper data pad electrode.

11. The method as claimed in claim 4, wherein the protective film interfaces with the pixel electrode, the second upper storage electrode.

* * * * *